United States Patent
Vanderpot et al.

(10) Patent No.: US 6,428,262 B1
(45) Date of Patent: Aug. 6, 2002

(54) COMPACT LOAD LOCK SYSTEM FOR ION BEAM PROCESSING OF FOUPS

(75) Inventors: John W. Vanderpot, Boxford; John D. Pollock, Rowley, both of MA (US)

(73) Assignee: Proteros, LLC, Danvers, MA (US)

( * ) Notice: Subject to any disclaimer, the term of this patent is extended or adjusted under 35 U.S.C. 154(b) by 0 days.

(21) Appl. No.: 09/637,096

(22) Filed: Aug. 10, 2000

Related U.S. Application Data (60) Provisional application No. 60/148,376, filed on Aug. 11, 1999.

(51) Int. Cl.[7] .............................................. B65G 49/07
(52) U.S. Cl. ..................... 414/217; 414/217.1; 414/805; 414/939
(58) Field of Search ............................. 414/217, 217.1, 414/222.01, 939, 222.13, 222.07, 805

(56) References Cited

U.S. PATENT DOCUMENTS

| | | | |
|---|---|---|---|
| 4,547,247 A | * 10/1985 | Warenback et al. | ..... 414/217 X |
| 4,726,689 A | 2/1988 | Pollock | |
| 4,922,106 A | 5/1990 | Berrian et al. | |
| 5,019,233 A | * 5/1991 | Blake et al. | ............. 414/217 X |
| 5,028,795 A | 7/1991 | Sakurada et al. | |
| 5,067,218 A | 11/1991 | Williams | |
| 5,292,393 A | 3/1994 | Maydan et al. | |
| 5,455,082 A | 10/1995 | Saito et al. | |
| 5,486,080 A | * 1/1996 | Sieradzki | ..................... 414/217 |
| 5,788,458 A | 8/1998 | Bonora et al. | |
| 5,793,050 A | * 8/1998 | Rose et al. | ............. 414/217 X |
| 6,007,675 A | 12/1999 | Toshima | |
| 6,048,154 A | 4/2000 | Wytman | |

FOREIGN PATENT DOCUMENTS

JP 10-92733 * 4/1998

* cited by examiner

Primary Examiner—Steven A. Bratlie
(74) Attorney, Agent, or Firm—Lathrop & Gage L.C.

(57) ABSTRACT

The system processes one or more wafers from a FOUP to an ion processing chamber. A group of wafers from the FOUP is removed by a first end effector and loaded into a load lock through a lower door in an atmosphere opened position. The load lock is sealed, evacuated, and an upper door is opened to a vacuum opened position. A second end effector connected to a 3-axis robot moves one of the wafers from the load lock to the ion processing chamber. A wafer alignment robot can also be used. Wafers are sequentially processed from the load lock to the processing chamber until complete; and then the wafers within the load lock are sealed, pressurized, and moved back to the FOUP. A second load lock, and multiple FOUPs, are used to increase throughput.

27 Claims, 14 Drawing Sheets

COMPACT LOAD LOCK SYSTEM FOR ION BEAM PROCESSING OF FOUPS

RELATED APPLICATIONS

This application claims priority from U.S. Provisional Application No. 60/148,376, filed Aug. 11, 1999 which is expressly incorporated herein by reference.

BACKGROUND OF THE INVENTION

Ion beam processing systems for ion implantation of wafers are known. The prior art is familiar for example with systems that scan ion beams across target objects so as to selectively dope the target surface. U.S. Pat. No. 5,028,795, entitled "Ion Implantation Apparatus" describes one such system, and is hereby incorporated by reference. In the '795 patent, two multi-pole electrostatic deflectors are used to scan the beam in two dimensions across the target surface.

The prior art is also familiar with magnetically-controlled ion beam scanning systems. U.S. Pat. No. 4,922,106, entitled "Ion Beam Scanning Method and Apparatus," describes one such system, and is also incorporated by reference. In the '106 patent, a magnetic deflector with two truncated sector-shaped poles is used to control the ion beam so as to maintain a parallel beam path and a scan direction.

The prior art is further aware of systems which mechanically scan the target object in one direction, and which electrostatically or magnetically scan the beam in the other direction. In combination, therefore, such systems provide a raster scan that fully covers the target object surface. U.S. Pat. No. 4,726,689, entitled "Linear Gas Bearing with Integral Vacuum Seal for use in Serial Process Ion Beam Implantation Apparatus," describes one related system, and is likewise incorporated by reference. In the '689 patent, linear gas bearings are used to provide both linear axial motion and a high differential pressure link between ambient pressure and the internal chamber vacuum.

Wafers are typically provided to ion processing systems in a FOUP (front opening unified pod), known in the art. FOUPs are heavily standardized; and so systems must accommodate interfacing to FOUPs. Certain systems process wafers at upwards of 240 wafers/hour; and so the mechanical interface and robotics between the system and the FOUPs are very important.

One problem is that FOUPs are also standardized at a certain height off of the floor. Ion implantation systems, on the other hand, are relatively high, with the scanning beam approximately five feet off of the floor. Thus, a long travel distance exists between the FOUPs and the ion scanning system, resulting in a travel time that conflicts with throughput goals between the FOUPs, the load lock mechanisms, and the ion scanning system.

One object of the invention is to provide a compact load lock system that increases the timing throughput between FOUPs and the ion scanning system. Other objects will be apparent in the description which follows.

SUMMARY OF THE INVENTION

In one aspect, a method is provided for processing one or more wafers from a FOUP to an ion processing chamber. A group of wafers is moved from the FOUP by a first end effector and loaded into a load lock by raising the first end effector and by lowering a first load lock door of the load lock at a first atmosphere opened position. The first load lock is then sealed to its sealed position by raising the first load lock door. The load lock is then evacuated; and a second load lock door of the load lock is raised to a vacuum opened position. Finally, a 3-axis robot moves one of the wafers from the load lock to the ion processing chamber.

In another aspect, the group of wafers has one to twenty five wafers.

In still another aspect, the FOUP is selected from one of several (typically four) FOUPs.

In yet another aspect, the step of moving one of the group of wafers to the ion processing chamber includes utilizing a wafer alignment robot.

In still another aspect, the step of loading the group of wafers into a load lock includes selecting and loading into one of a plurality of load locks.

In one aspect, wafers are processed sequentially from the load lock to the ion processing chamber; and then the load lock is sealed so that processed wafers are moved back to an appropriate FOUP.

In another aspect, the method includes the step of lowering the second load lock door to its sealed position by lowering the second load lock door.

In one aspect, the method includes the steps of reloading the wafer from the chamber to the load lock, sealing the load lock by lowering the second load lock door, repressurizing the load lock, lowering the first load lock door, removing the group of wafers from the load lock and transporting the group to the FOUP.

In yet another aspect, a system is provided for coupling wafers within FOUPs to an ion processing chamber. The system includes one or more FOUPs adjacent a robot track section. A vacuum robot section with one or more load locks is also adjacent the robot track section. Each of the load locks has a lower load lock door and an upper load lock door. The lower load lock door is movable between an atmosphere opened position and a sealed position. The upper load lock door is movable between a vacuum opened position and a sealed position. The track section has an ATM robot for moving one or more wafers from one of the FOUPs to a load lock through the lower load lock door in its atmosphere opened position. The system also includes a ion beam processing chamber; and the vacuum robot section has one or more 3-axis robots to move one wafer from a load lock through the upper load lock door in its vacuum opened position to the ion beam processing chamber.

BRIEF DESCRIPTION OF THE DRAWINGS

FIG. 8 shows a side view.

DETAILED DESCRIPTION OF THE DRAWINGS

Figure 1:
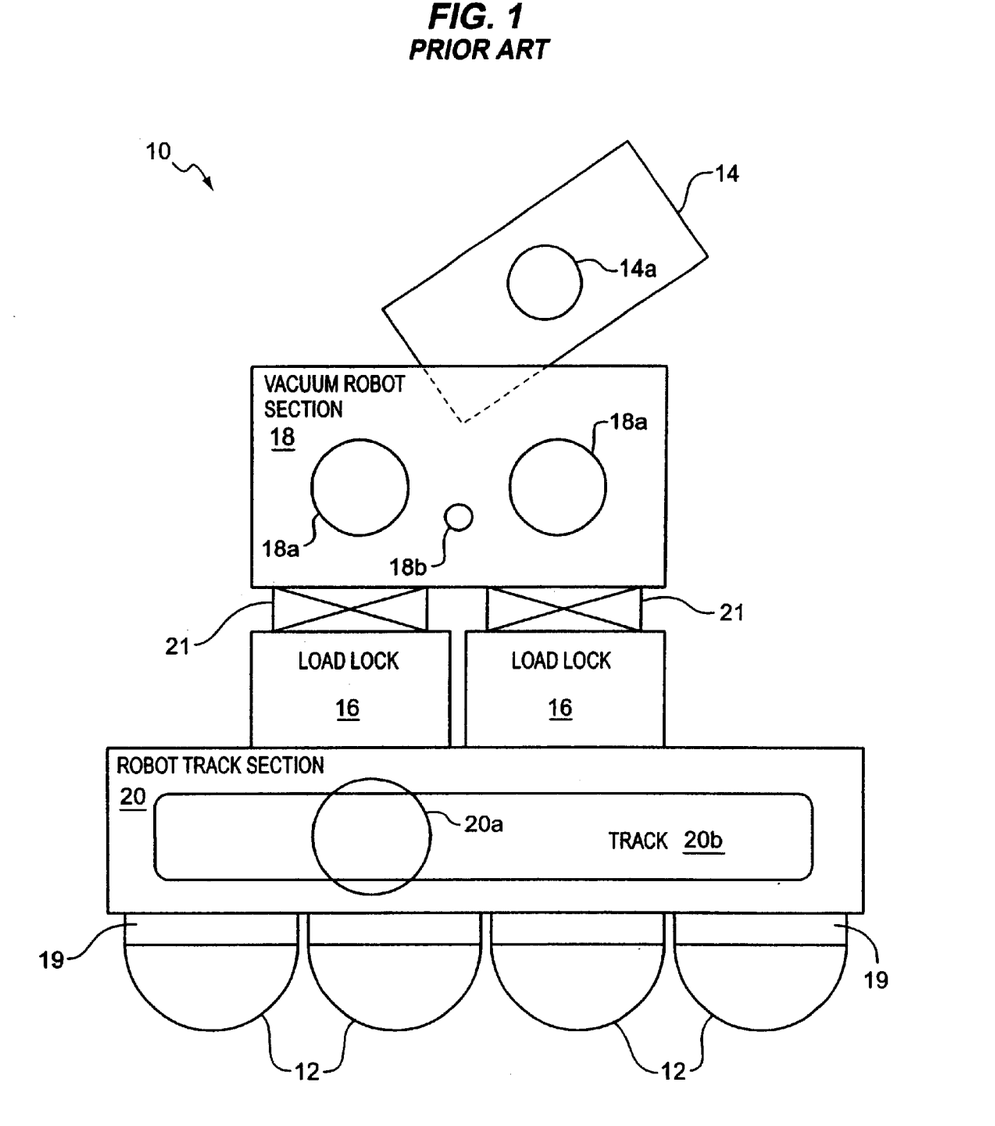
FIG. 1 shows a top view of a prior art ion processing system with FOUPs.

FIG. 1 shows a top view of a prior art ion processing system 10 interfacing with prior art FOUPs 12. Wafers within the FOUPs 12 travel from FOUPs 12 to process chamber 14 through robot track section 20, load-locks 16 and vacuum robot section 18. Pod doors 19 interface between FOUPs 12 and robot track section 20 so that wafers can pass between FOUPs 12 and robot track section 20. In robot track section 20, typically pressured to atmosphere, ATM robot 20a transports wafers along track 20b to move wafers between desired load locks 16 and FOUPS 12. Vacuum interfaces 21 provide atmospherically controlled valves between vacuum robot section 18 and respective load locks 16. Vacuum robot section 18 has for example two vacuum robots 18a and a wafer alignment robot 18b, as known in the art. Once in processing chamber 14, a wafer is typically mounted on wafer handler 14a and implanted with ion beams.

Figure 2:
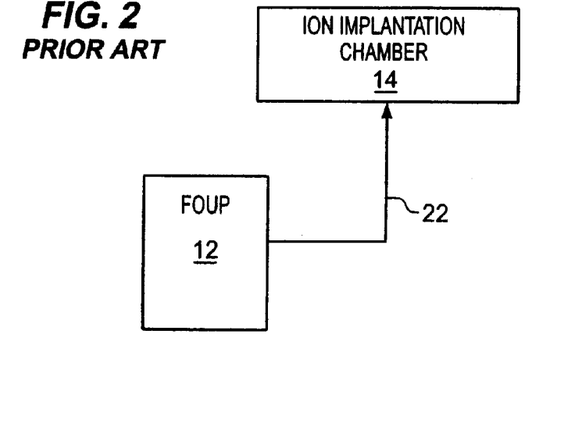
FIG. 2 illustrates travel distance and motion between FOUPs and a processing chamber, in the prior art.

FIG. 2 illustrates one problem in the prior art by specifically showing wafer travel distance 22 between FOUPs 12 and processing chamber 14. The difficulty with travel distance 22 is that additional time is required to transport wafers along distance 22; and, in addition, travel distance 22 requires certain transport mechanisms, with longer strokes, to compensate for the height differential between FOUPs 12 and chamber 14.

Figure 3:
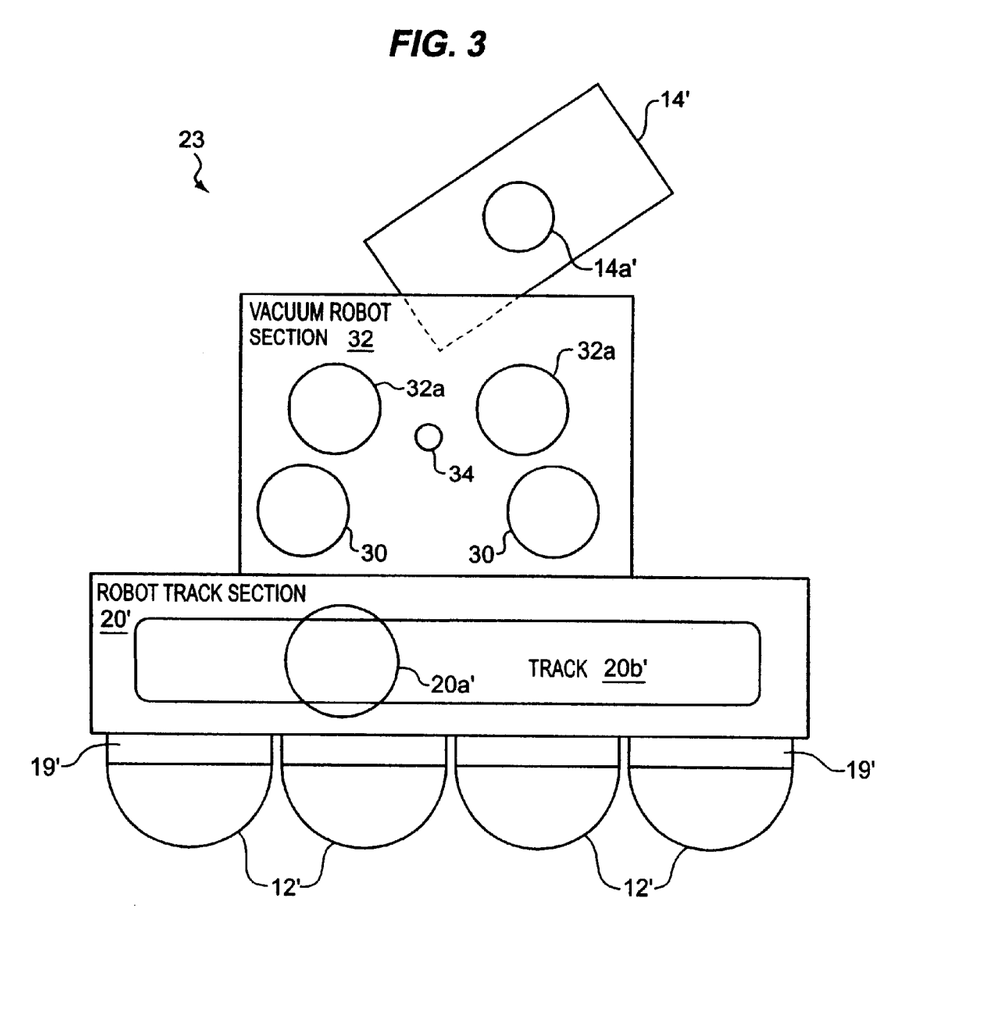
FIG. 3 is a depiction of one load lock system constructed according to the invention.

FIG. 3 shows a system 23 constructed according to the invention, to overcome the difficulties in the prior art as shown in FIGS. 1 and 2. In FIG. 3, like numbers indicate similar mechanisms and functionality. The main difference between FIG. 1 and FIG. 3 is that the load locks are now co-located with the vacuum robot section, thereby decreasing the volume and optimizing operations undertaken throughout the travel distance 22, FIG. 2. Specifically, wafers within FOUPs 12' travel from FOUPs 12' to process chamber 14' through robot track section 20' and vacuum robot section 32. Pod doors 19' interface between FOUPs 12' and robot track section 20' so that wafers can pass between FOUPs 12' and robot track section 20'. In robot track section 20'. typically pressured to atmosphere, ATM robot 20a' transports wafers along track 20b' to move wafers between desired load locks 30 and FOUPS 12. ATM robot 20a' additionally moves wafers from track 20b' to load locks 30 located within section 32. Therefore, unlike system 10, FIG. 1, vacuum robot section 32 has load locks 30 integrally disposed within section 32. As described below, the vacuum interface between robot track section 20' and vacuum robot section 32 is provided through the load locks 30. Vacuum robot section 32 can for example still have vacuum robots 32a and a wafer alignment robot 34, as known in the art; but fewer movements and shorter travel are preferred in system 23 as compared to system 10. As in FIG. 1, once in processing chamber 14', a wafer is typically mounted on wafer handler 14a' and implanted with ion beams.

Figure 4:
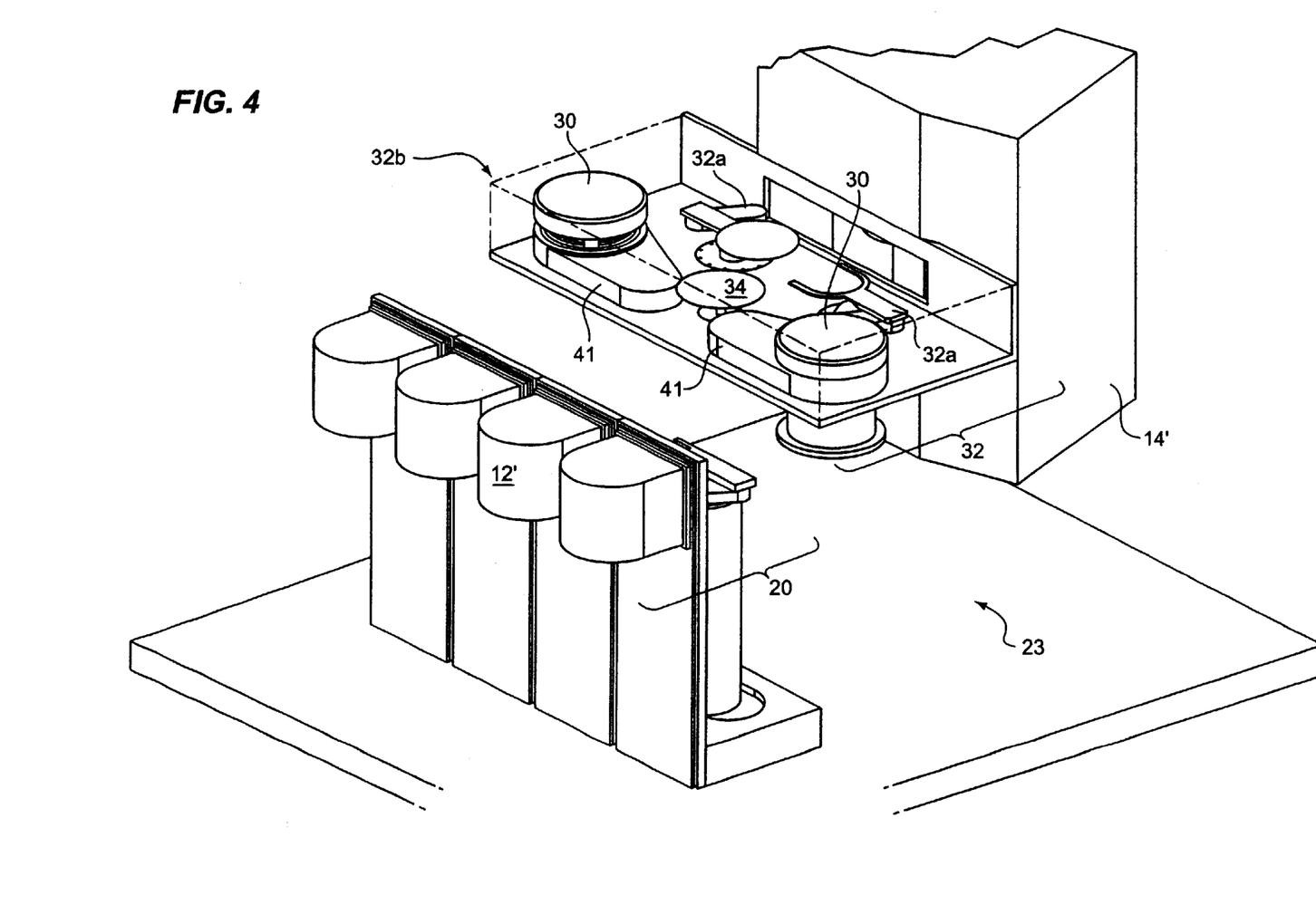
FIG. 4 shows a perspective view of the system of FIG. 3.

FIG. 4 illustrates a perspective view of system 23; and better illustrates load locks 30 within vacuum robot section 32. The chamber wall 32b of section 32 is shown transparently for purposes of illustration.

Figure 5:
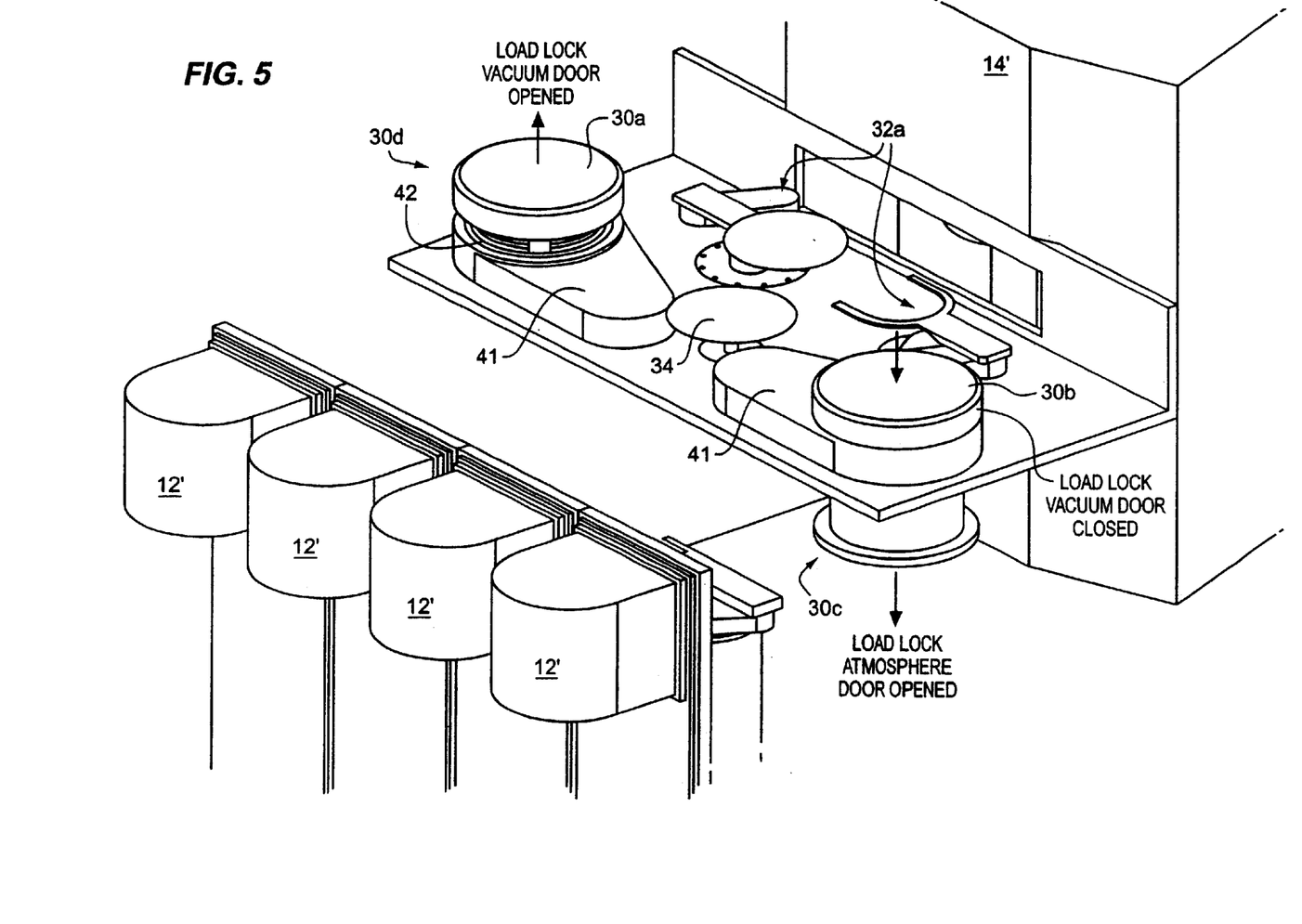
FIG. 5 shows a close-up perspective view of the load locks of FIG. 3.

FIG. 5 illustrates a perspective close-up view of load locks 30, including the 3-axis robots 32a and wafer alignment robot 34. Those skilled in the art should appreciate that wafer alignment robot 34 and robot 32a together align wafers for correct positioning within process chamber 14'. FIG. 5 also shows one load lock 30a in a vacuum door opened position and one load lock 30b in an atmospheric door opened position. Load lock 30a illustratively shows wafers 42 inside. Accordingly, load locks 30 provide the pressure control interface between vacuum robot section 32 and robot track section 20'. Specifically, wafers 42 are loaded in atmosphere to the bottom 30c of load lock 30, in its atmospheric door opened position, and exit through the top 30d of load lock 30, in evacuated vacuum robot section 32, in a vacuum door opened position; and vice versa. Load lock vacuum manifold 41 provides piping through which evacuation to a vacuum pump takes place; manifold 41 is also integrated with vacuum robot section 20'.

Figure 6:
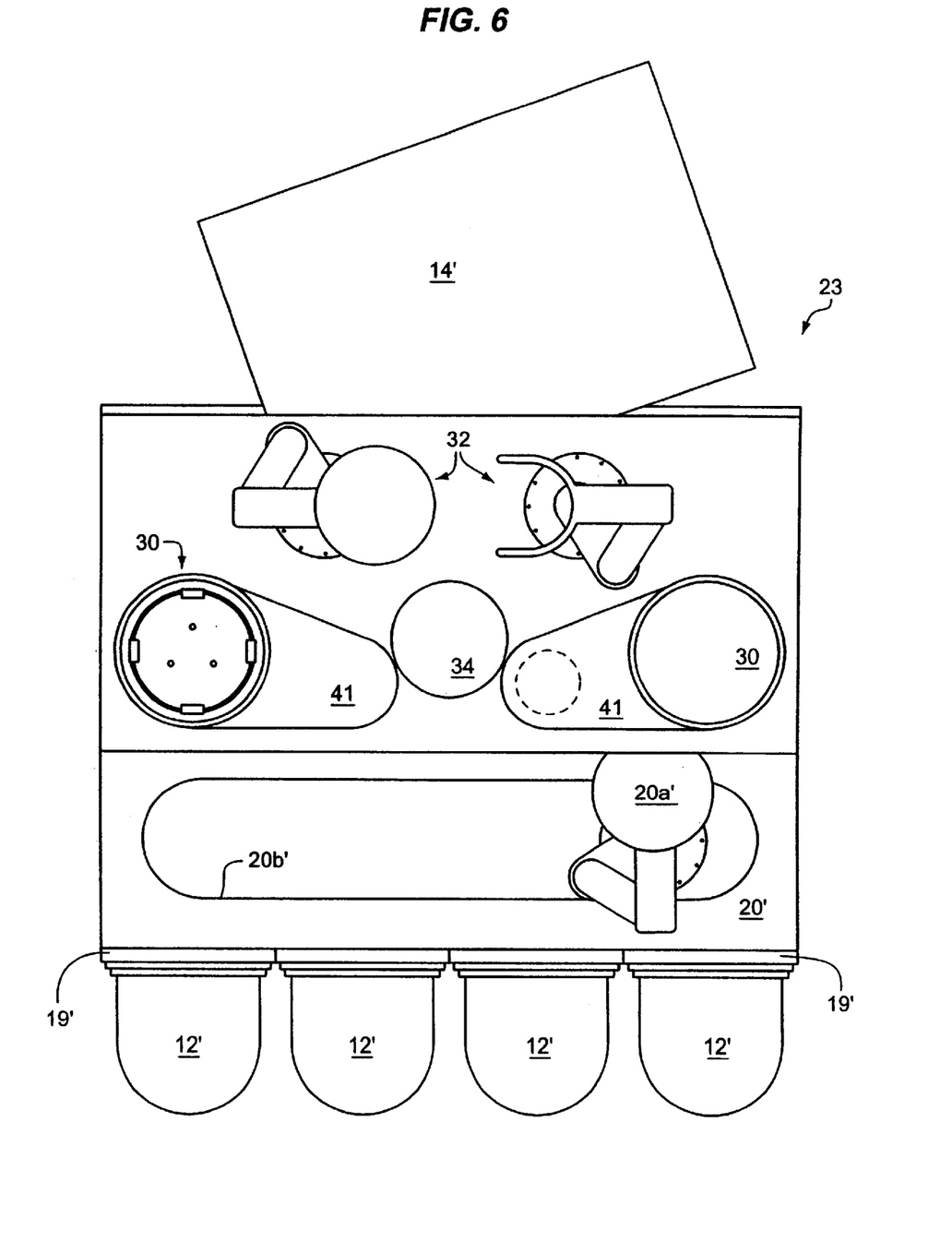
FIG. 6 shows a top view of the system of FIG. 3.

FIG. 6 show a front end top view of system 23, including robots 32a, wafer alignment robot 34, load locks 30, FOUPs 12', chamber 14' and robot track section 20'.

Figure 7:
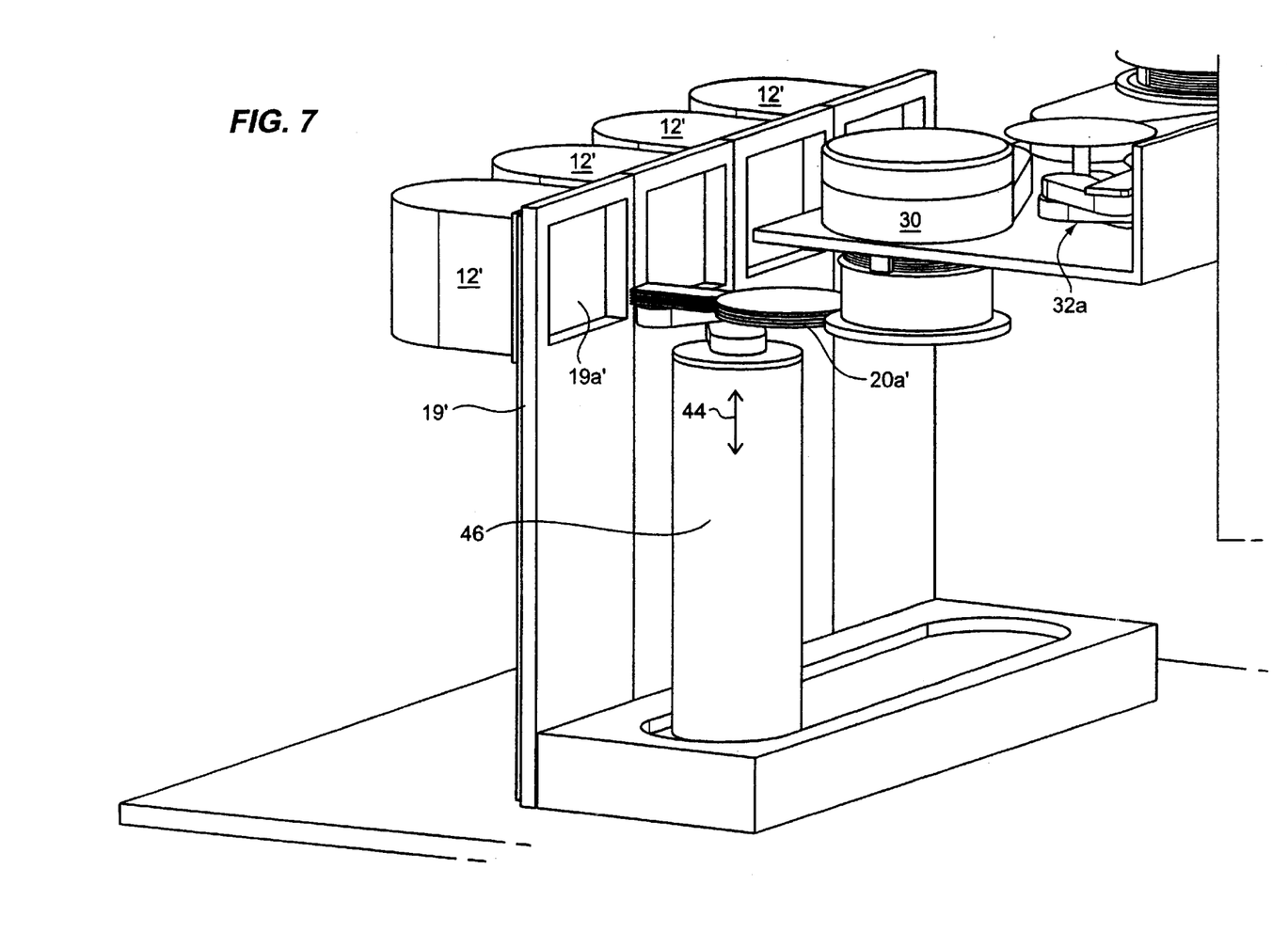
FIG. 7 shows a perspective view of the system of FIG. 3, showing one operation of the robot track section in accord with the invention.
Figure 7A:
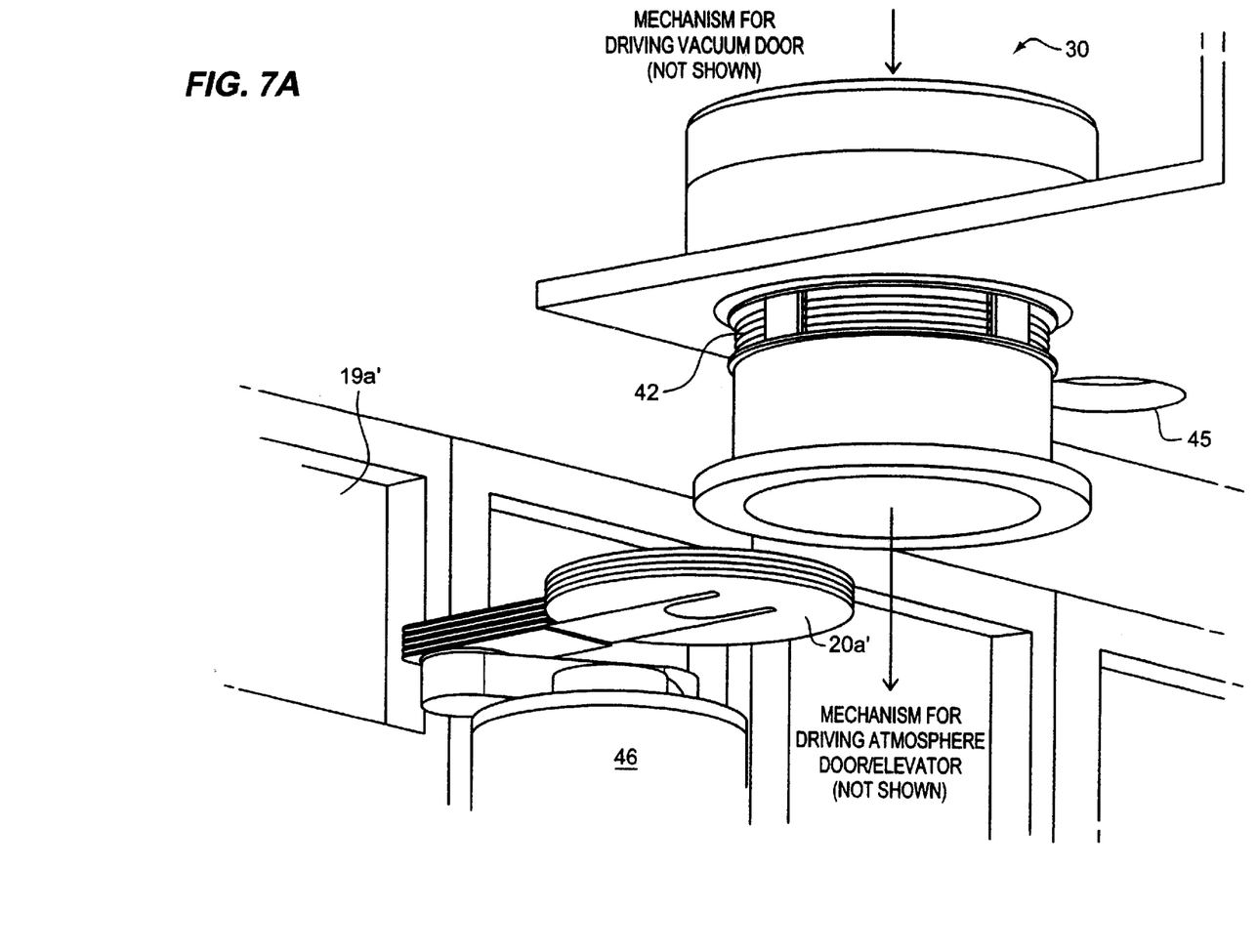
FIG. 7a shows a close-up perspective view of the load lock of the invention.
Figure 7B:
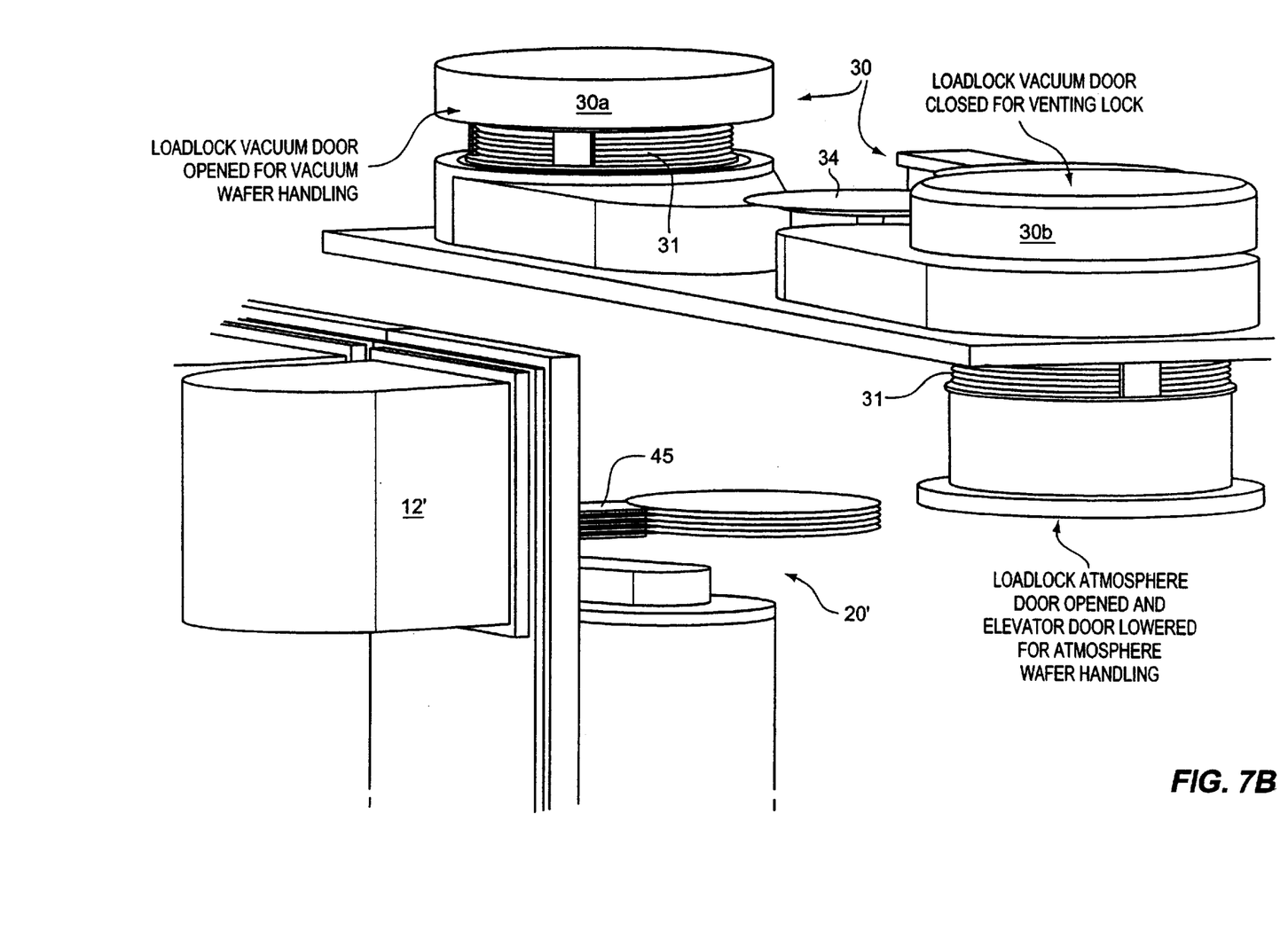
FIG. 7b shows a perspective close up view of the robot track section 20' with multi-layer pickup, in accord with the preferred embodiment.

FIG. 7 shows a perspective view of the interaction between FOUPs 12' and load locks 30, through operation of ATM robot 20a'. FIG. 7 also more clearly shows pod doors 19', typically having an opening 19a' for 300 mm FOUPs 12'. ATM robot 20a' within track section 20' is thus preferably a 3-axis atmospheric robot with multiple-wafer pickup capability, providing vertical "z" motion 44 via cylinder 46. FIG. 7a shows a close-up perspective view of load lock 30, including a vacuum pumping port 45 for load lock. FIG. 7b shows another close-up perspective view of load lock 30, and of robot track section 20' interfacing with FOUPs 12'. In FIG. 7b, load lock 30a is shown in its vacuum opened position and load lock 30b is shown in its atmosphere opened position. Robot track section 20' is further shown with a multi-wafer pickup 46. Load lock 30 is shown with multiple-wafer cassettes 31.

Figure 8:
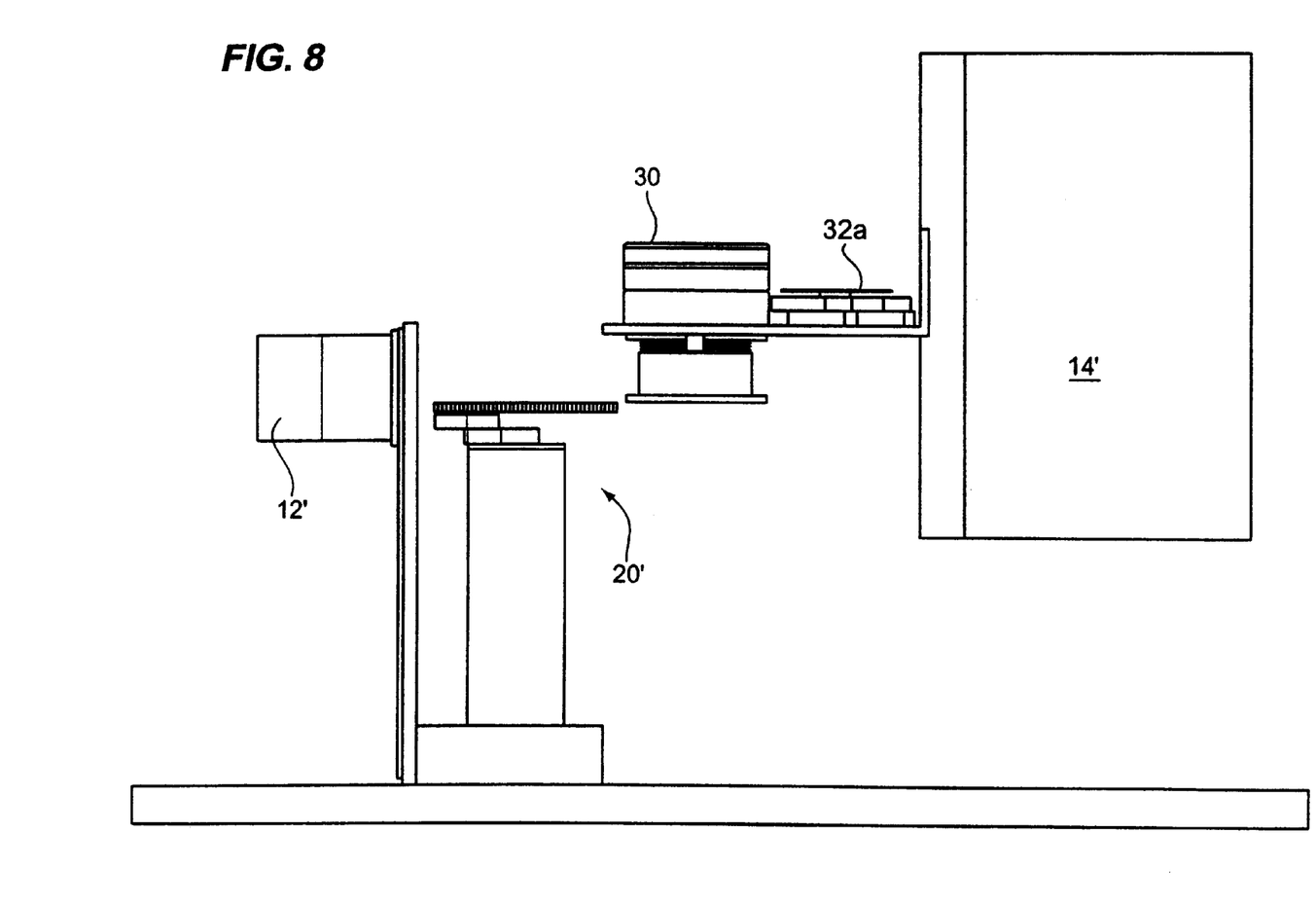

FIG. 8 shows a side view of system 23, including robot track section 20', load lock 30, robot 32a and chamber 14'. For illustration purposes, not all parts of system 23 are shown in FIG. 8.

Figure 9:
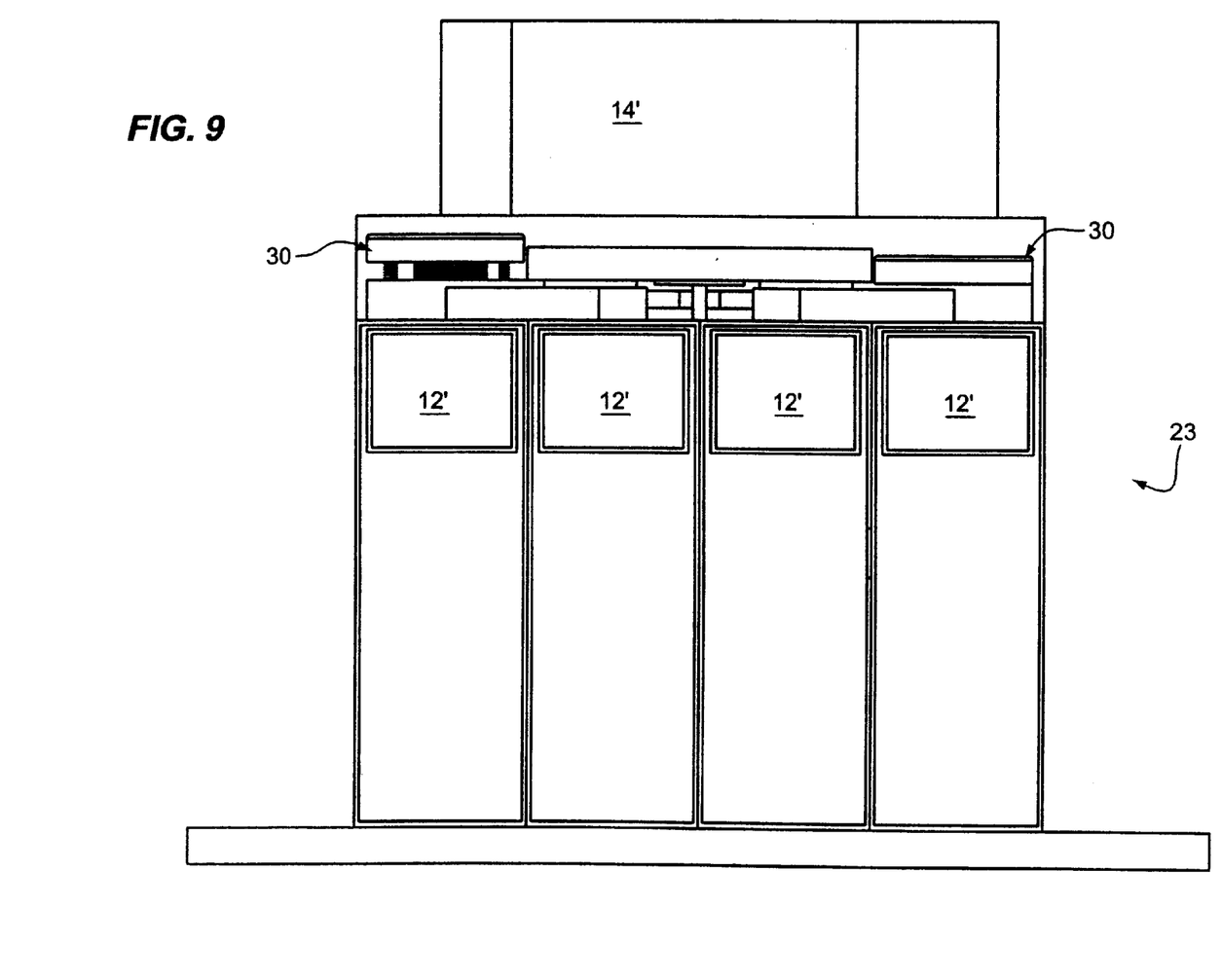
FIG. 9 shows a front view, of the system of FIG. 3.

FIG. 9 shows a front view of system 23 in one illustrative embodiment.

Figure 10:
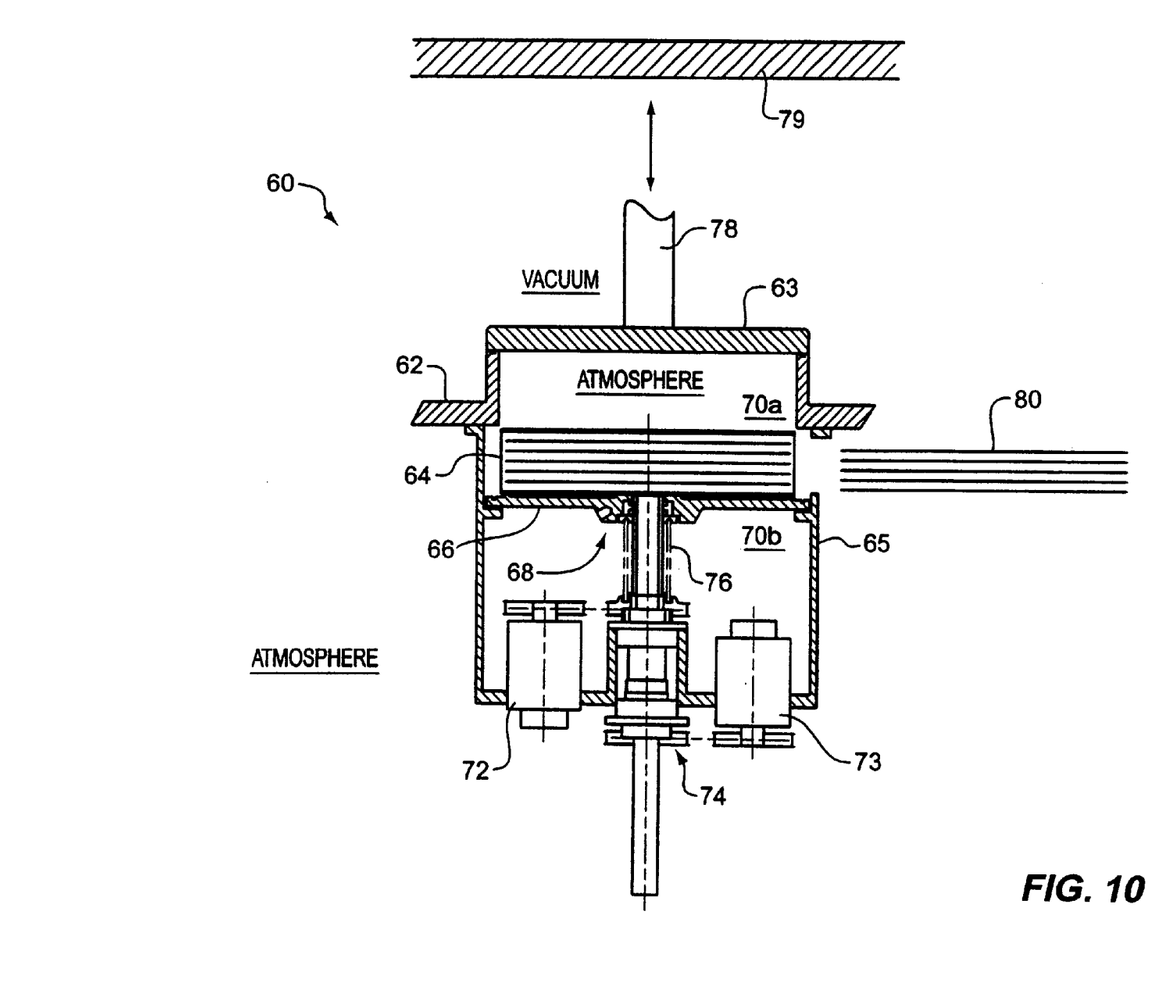
FIGS. 10–13 show operational cross-sectional views of one load lock constructed according to the invention.

FIGS. 10–13 show cross-sectional views of one load lock 60, constructed according to the invention and in different operational positions. FIG. 10 for example showsload lock 60 with the following items and features:

load lock chamber 62, load lock cover 63 and housing 65 provide the outer structure for load lock 60;

wafer carrier 64 holds multiple wafers;

seal plate 66 seals the top 70a of load lock 60 from the bottom 70b of load lock 60;

differentially pumped lip seals 68 support the pressure interface of seal plate 66;

rotary drive motor 72, linear drive motor 73, spring 76 and linear/rotary drive unit 74 provide vertical and rotational motion of wafer carrier 64 andior load lock cover 63, selectively.

Load lock 60 is evacuated through one of several mechanisms. By way of example, a vacuum conduit 78 is connected to load lock 60 for pumping to desired pressures through the wall 79 of vacuum robot section 32, FIG. 3. FIG. 10 also shows the end effector 80 of the ATM robot 20a'. FIG. 3. Accordingly, load lock 60 of FIG. 10 is in the atmosphere opened position.

Figure 11:
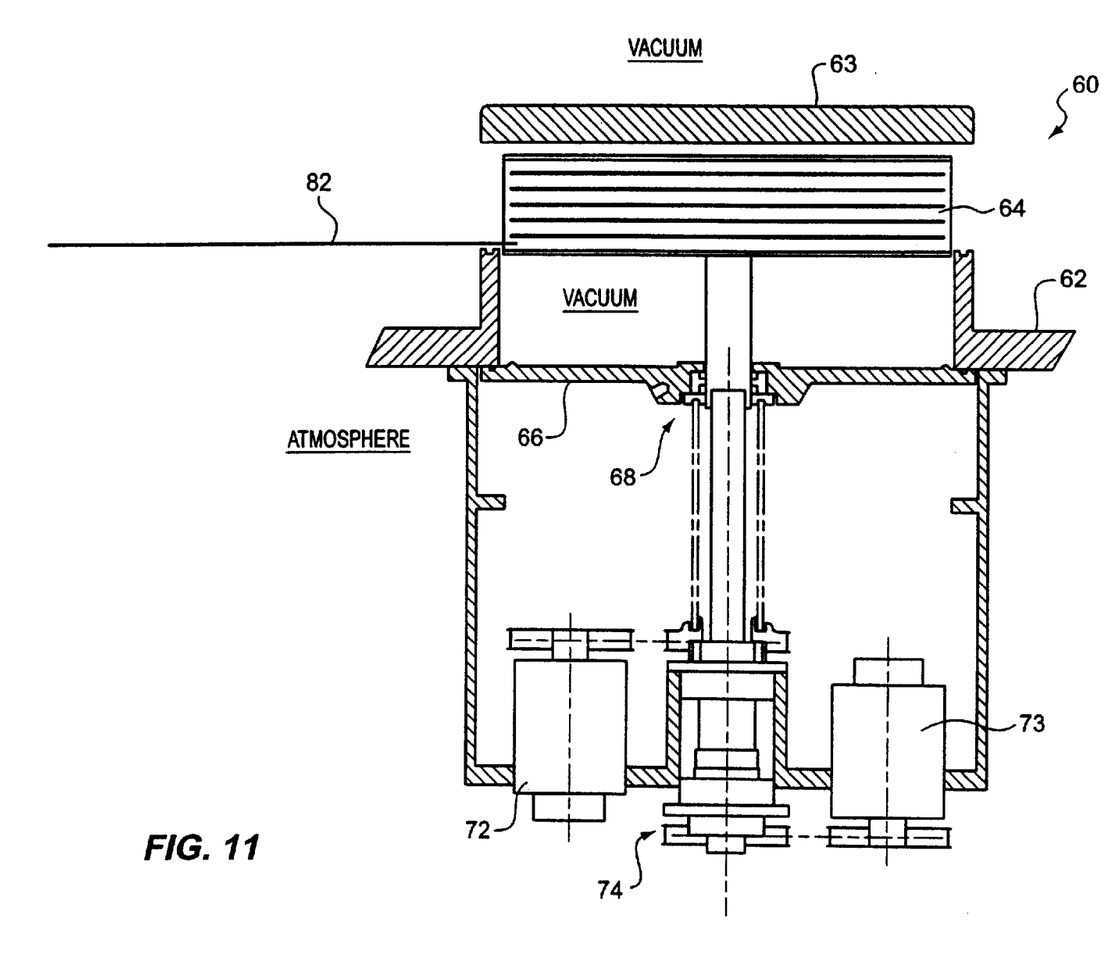

FIG. 11 shows load lock 60 in a different position—the vacuum opened position—so that robot end effector 82 (e.g., similar to robot 32a, FIG. 3) can access and remove/insert a wafer carrier 64.

Figure 12:
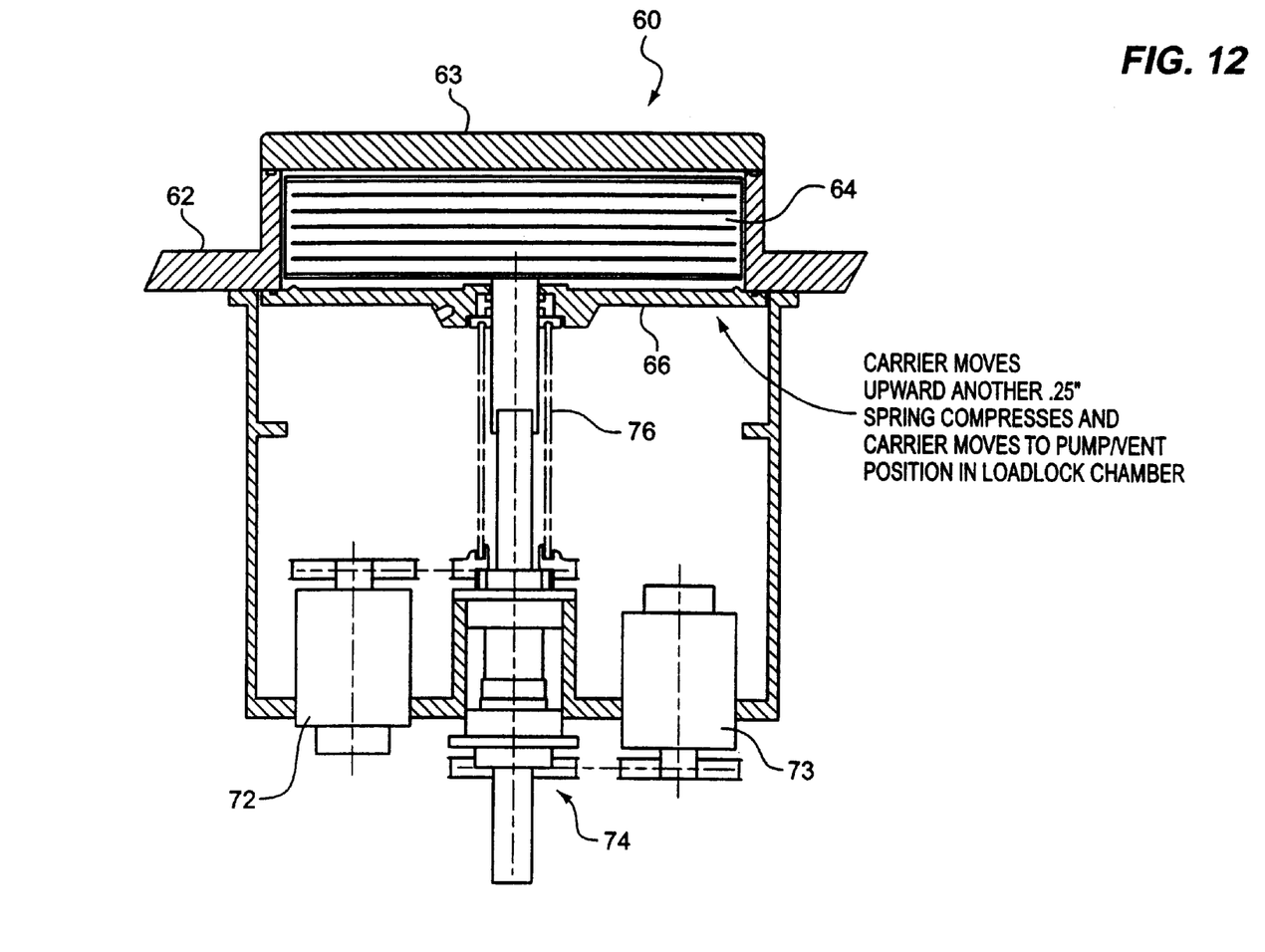

FIG. 12 shows load lock 60 in a pump vent condition. Wafers in carrier 64 are sealed from both end effectors 82, 80. As shown, when in the pump vent condition, carrier 64 moves upward another one-quarter inch to compress spring 76 against seal plate 66.

Figure 13:
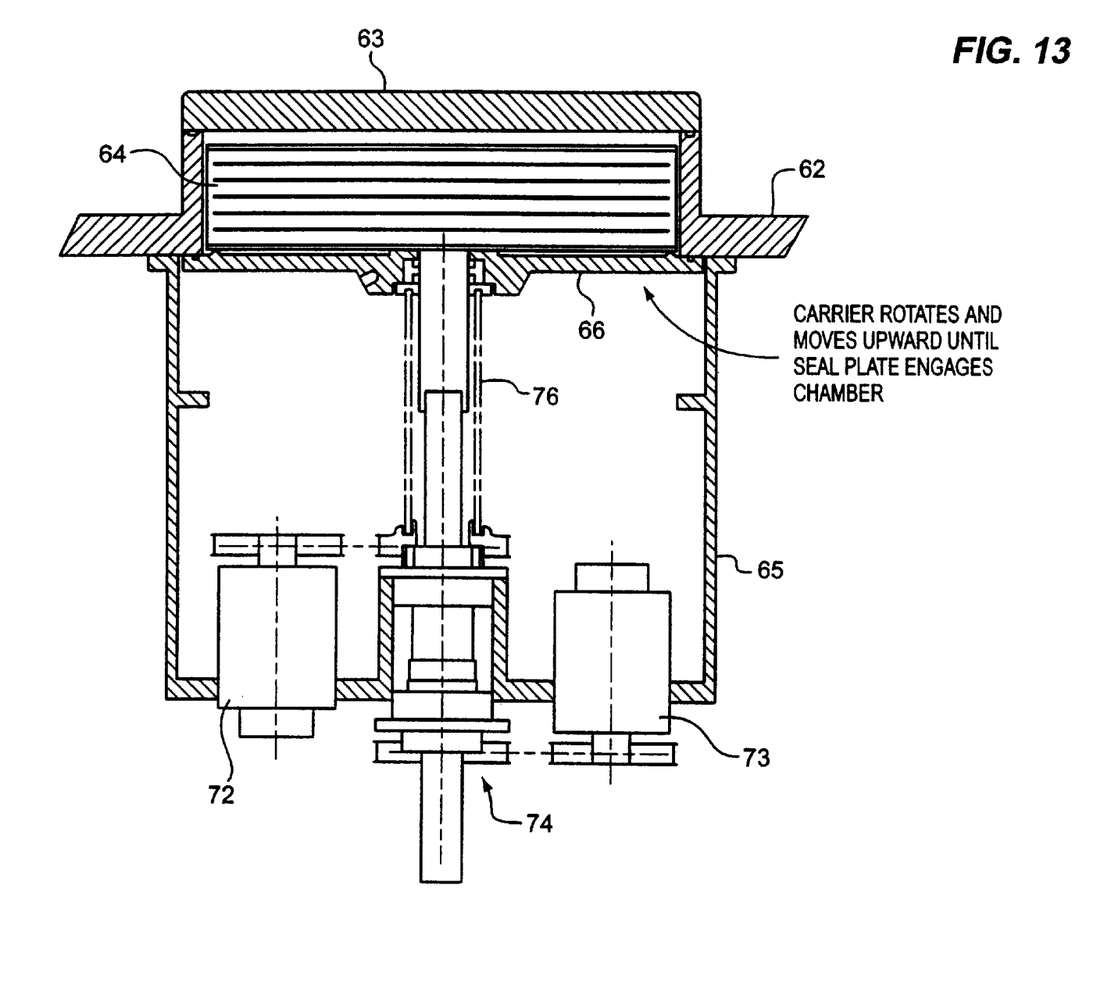

FIG. 13 shows another position of carrier 64, indicating when seal plate 66 engages chamber 62.

The invention thus attains the objects set forth above, among those apparent from preceding description. Since certain changes may be made in the above systems and methods without departing from the scope of the invention, it is intended that all matter contained in the above description or shown in the accompanying drawing be interpreted as illustrative and not in a limiting sense.

In view of the foregoing, what is claimed is:

1. A method for processing one or more wafers with a processing chamber, comprising the steps of:
   lowering a bottom load lock door of a load lock along a vertical axis and to an atmosphere opened position;
   horizontally loading one or more wafers into the load lock so that they are substantially centered about the vertical axis;
   sealing the load lock to a sealed position by raising the bottom load lock door along the vertical axis;
   evacuating the load lock;
   raising an upper load lock door of the load lock along the vertical axis and to a vacuum opened position; and
   horizontally transporting one or more of the wafers from the load lock and to the processing chamber.

2. A method of claim 1, wherein the step of loading one or more wafers comprises loading a group comprising one to twenty five wafers.

3. A method of claim 1, further comprising the step of removing the one or more wafers from a FOUP prior to the step of loading.

4. A method of claim 1, wherein the step of transporting further comprises utilizing a wafer alignment robot.

5. A method of claim 1, wherein the step of loading comprises loading into one of a plurality of similar load locks.

6. A method of claim 1, further comprising the steps of horizontally transporting a wafer from the processing chamber to the load lock and horizontally transporting another wafer from the load lock to the processing chamber.

7. A method of claim 1, further comprising the step of lowering the upper load lock door along the vertical axis to its sealed position by lowering the upper load lock door.

8. A method of claim 1, further comprising the steps of reloading a wafer from the processing chamber to the load lock, sealing the load lock by lowering the upper load lock door, repressurizing the load lock, lowering the first load lock door along the vertical axis, horizontally removing the wafer from the load lock and transporting the wafer to a FOUP.

9. A method of claim 1, wherein the step of transporting one of the wafers comprises utilizing a 3-axis robotic end effector.

10. A system for coupling wafers within FOUPs to a processing chamber, comprising:
    one or more FOUPs adjacent a robot track section;
    a vacuum robot section with one or more load locks adjacent the robot track section;
    each of the load locks having a lower load lock door and an upper load lock door, the lower load lock door being movable along a vertical axis between an atmosphere opened position and a first vacuum sealed position, the upper load lock door being movable along the vertical axis between a second vacuum sealed position and a vacuum opened position, the lower load lock door and the upper load lock door being substantially centered about the vertical axis;
    the robot track section constructed and arranged to move one or more wafers from one of the FOUPs into a load lock when the lower load lock door is in its atmosphere opened position;
    a processing chamber; and
    the vacuum robot section constructed and arranged to move one wafer from a load lock when the upper load lock door is in its vacuum opened position to the processing chamber.

11. A system of claim 10, the track section comprising a robot having a first end effector for removing and alternatively replacing wafers from and to one of the FOUPs.

12. A system of claim 10, the vacuum robot section comprising a robot having a second end effector for removing and alternatively replacing a wafer from and to a load lock.

13. A system of claim 10, further comprising a wafer alignment robot, the wafer alignment robot acting cooperatively with the vacuum robot section to move wafers between the processing chamber and a load lock.

14. A system of claim 10, further comprising between about one and twenty-five wafers within at least one of the FOUPs.

15. A load lock for a wafer processing system, comprising:
    a first load lock door;
    a second load lock door; and
    an interior chamber for containing a group of wafers;
    the first load lock door being substantially centered about a vertical axis and being movable along the vertical axis between a first sealed position and an atmosphere opened position;
    the second load lock door being substantially centered about the vertical axis and being movable along the vertical axis between a second sealed position and a vacuum opened position;
    the load lock being vacuum tight when the first and second load lock doors are in the first and second sealed positions so as to separately evacuate the interior chamber;
    wherein one or more wafers may be loaded into, or removed from, the interior chamber when the first load lock door is in the atmosphere opened position;
    and wherein at least one wafer may be loaded into, or removed from, the interior chamber when the second load lock door is in the vacuum opened position.

16. A method of claim 1, wherein the step of lowering a bottom load lock door comprises lowering a bottom load lock door that is substantially centered about the vertical axis.

17. A method of claim 16, wherein the step of lowering a bottom load lock door comprises lowering a substantially circular load lock door.

18. A method of claim 16, wherein the step of lowering a bottom load lock door comprises lowering a substantially circular load lock door integral with the bottom of a substantially cylindrical load lock.

19. A method of claim 1, wherein the step of raising an upper load lock door comprises raising an upper load lock door that is substantially centered about the vertical axis.

20. A method of claim 19, wherein the step of raising an upper load lock door comprises raising a substantially circular load lock door.

21. A method of claim 19, wherein the step of raising an upper load lock door comprises raising a substantially circular load lock door integral with the top of a substantially cylindrical load lock.

22. A system of claim 10, wherein the load lock doors have a substantially circular shape perpendicular to the vertical axis.

23. A system of claim 22, wherein each load lock has a top, and an upper load lock door is integral with the top of the load lock.

24. A system of claim 22, wherein each load lock has a bottom, and a lower load lock door is integral with the bottom of the load lock.

25. A system of claim 10, wherein the load locks have a substantially cylindrical shape.

26. A system of claim 15, wherein the load lock doors have a substantially circular shape perpendicular to the vertical axis.

27. A system of claim 26, wherein the load lock has a substantially cylindrical shape with a first end and a second end arranged along the vertical axis, the first load lock door is integral with the first end, and the second load lock door is integral with the second end.

* * * * *